US012707931B2

(12) United States Patent
Takahashi et al.

(10) Patent No.: US 12,707,931 B2
(45) Date of Patent: Aug. 11, 2026

(54) SUBSTRATE HOLDER

(71) Applicant: NGK SPARK PLUG CO., LTD., Nagoya (JP)

(72) Inventors: Kazuya Takahashi, Nagoya (JP); Naotoshi Morita, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 179 days.

(21) Appl. No.: 18/065,775

(22) Filed: Dec. 14, 2022

(65) Prior Publication Data

US 2023/0187252 A1 Jun. 15, 2023

(30) Foreign Application Priority Data

Dec. 14, 2021 (JP) ................................ 2021-202450
Nov. 10, 2022 (JP) ................................ 2022-180447

(51) Int. Cl.
*H10P 72/72* (2026.01)

(52) U.S. Cl.
CPC .................................. *H10P 72/722* (2026.01)

(58) Field of Classification Search
CPC .................................................. H01L 21/6833
USPC ......................................................... 361/234
See application file for complete search history.

(56) References Cited

U.S. PATENT DOCUMENTS

| | | | | |
|---|---|---|---|---|
| 10,410,897 | B2 * | 9/2019 | Miwa | H01L 21/68757 |
| 11,532,497 | B2 * | 12/2022 | Cho | H01L 21/6833 |
| 2018/0190529 | A1 * | 7/2018 | Takebayashi | H01L 21/6833 |
| 2021/0287885 | A1 | 9/2021 | Takebayashi | |

FOREIGN PATENT DOCUMENTS

| | | | | | |
|---|---|---|---|---|---|
| JP | H08-125001 | A | | 5/1996 | |
| JP | 2018-5999 | A | | 1/2018 | |
| JP | 2018005999 | A | * | 1/2018 | H05B 3/10 |
| JP | 2019216201 | A | * | 12/2019 | |
| JP | 2020-004946 | A | | 1/2020 | |

(Continued)

OTHER PUBLICATIONS

Japan Patent Office, Office Action (Notice of Reasons for Refusal) issued in corresponding Application No. 2022-180447, dispatched Feb. 17, 2026.

(Continued)

*Primary Examiner* — Crystal L Hammond
*Assistant Examiner* — Samantha L Faubert
(74) *Attorney, Agent, or Firm* — Stites & Harbison, PLLC; Jeffrey A. Haeberlin

(57) ABSTRACT

There is provided a substrate holder including: a ceramic base member; a plurality of electrodes and at least one conductive member embedded in the ceramic base member; a plurality of connecting parts electrically connecting the plurality of electrodes and the at least one conductive member such that each of the at least one conductive member is connected to at least one of the plurality of electrodes; a plurality of terminals provided on at least one of the plurality of electrodes or the at least one conductive member. A resistance value between a connecting part connected to the at least one conductive member and a terminal provided on the at least one conductive member is smaller than a resistance value between both ends of each of the plurality of electrodes. The number of the plurality of terminals is smaller than two times the number of the plurality of electrodes.

12 Claims, 8 Drawing Sheets

(56) References Cited

FOREIGN PATENT DOCUMENTS

| | | | |
|---|---|---|---|
| JP | 2020-191315 | A | 11/2020 |
| TW | 202142044 | A | 11/2021 |

OTHER PUBLICATIONS

Korean Intellectual Property Office, Office Action issued in corresponding Application No. 10-2022-0174009, dispatched Mar. 10, 2026.

Taiwan Intellectual Property Office, Ministry of Economic Affairs, Office Action (Notification for the Opinion of Examination) issued in corresponding Application No. 111147727 dated May 19, 2026.

* cited by examiner 144
145
133
131C
151
154
141
142
152
143
123 (123a)
131
153
132

255
23C
246
247
234
251
254
210
231
241
242
243
233
252
253
244
232
245

SUBSTRATE HOLDER

REFERENCE TO RELATED APPLICATIONS

This application claims priorities from Japanese Patent Application No. 2021-202450 filed on Dec. 14, 2021 and Japanese Patent Application No. 2022-180447 filed on Nov. 10, 2022. The entire contents of the priority applications are incorporated herein by reference.

BACKGROUND ART

Technical Field

The present disclosure relates to a substrate holder which holds a substrate such as a silicon wafer, etc.

Background Art

As an example of a substrate holder which holds a substrate such as a wafer, there is known a ceramic heater in which two heat elements (heating resistors) corresponding to two different heating areas are embedded or buried.

DESCRIPTION

Problem to be Solved by the Invention

In the known ceramic heater described above, two terminals are connected to each of the two heating resistors so as to supply the electric power to the two heating resistors. Accordingly, the terminals of which number (quantity) is two times the number of the heating resistor are required.

The present disclosure has been made in view of the above-described circumstances; an object of the present disclosure is to provide, in a substrate holder in which a plurality of electrodes is embedded or buried, a technique capable of reducing the number of terminals configured to supply the electric power to each of the electrodes.

Summary

According to an aspect of the present disclosure, there is provided a substrate holder including: a ceramic base member having an upper surface and a lower surface facing the upper surface in an up-down direction; a plurality of electrodes embedded in the ceramic base member; at least one conductive member embedded in the ceramic base member; a plurality of connecting parts electrically connecting the plurality of electrodes and the at least one conductive member such that each of the at least one conductive member is connected to at least one of the plurality of electrodes; a plurality of terminals each of which is provided on at least one of the plurality of electrodes or the at least one conductive member. A resistance value between a connecting part, of the plurality of connecting parts, connected to the at least one conductive member and a terminal, of the plurality of terminals, provided on the at least one conductive member is smaller than a resistance value between both ends of each of the plurality of electrodes. The number of the plurality of terminals is smaller than two times the number of the plurality of electrodes.

In the above-described aspect, the number of the plurality of terminals is smaller than two times the number of the plurality of electrodes. With this, it is possible to make a space in which the plurality of terminals is arranged be small. Further, the resistance value between the connecting part, which is included in the plurality of connecting parts and which is connected to the at least one conductive member, and a part, of the at least one conductive member, which is connected to the terminal included in the plurality of terminals is smaller than the resistance value between both ends of each of the plurality of electrodes. With this, even in a case that an electrode included in the plurality of electrodes and a terminal included in the plurality of terminals are connected via the at least one conductive member and a connecting part included in the plurality of connecting parts, it is possible to suppress, as much as possible, the generation of heat in the at least one conductive member.

DESCRIPTION OF THE EMBODIMENT

Figure 1:
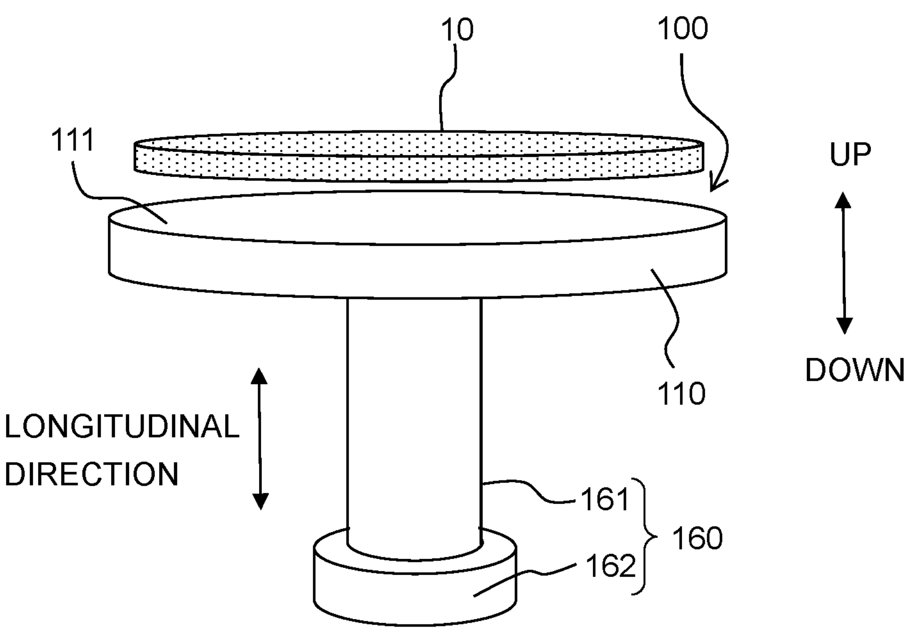
FIG. 1 is a perspective view of a substrate holder 100.

A substrate holder 100 according to an embodiment of the present disclosure will be explained, with reference to FIGS. 1 and 2. The substrate holder 100 according to the present embodiment is a ceramic heater used for heating a semiconductor wafer (herein after referred simply as to a "wafer 10") such as a silicon wafer, etc. Note that in the following explanation, an up-down direction is defined, with a state that the substrate holder 100 is installed usably (a state depicted in FIG. 1) as the reference. As depicted in FIG. 1, the substrate holder 100 according to the present embodiment is provided with a ceramic base member 110 and a shaft 160. Further, as depicted in FIGS. 2, 3A and 3B, electrodes 121 to 123, conductive members 131 to 133, connecting parts 141 to 145 and terminals 151 to 154 are embedded in the ceramic base member 110.

<Ceramic Base Member 110>

The ceramic base member 110 is a member having a shape of a circular plate of which diameter is 12 inches (approximately 300 mm) and of which thickness is 25 mm. A wafer 10 as an object of heating is placed on an upper surface 111 of the ceramic base member 110. Note that in FIG. 1, the wafer 10 and the ceramic base member 110 are illustrated to be separated from each other such that the drawing is easily viewed. The ceramic base member 110 can be formed, for example, of a ceramic sintered body of aluminum nitride, silicon carbide, alumina, silicon nitride, etc.

Figure 2:
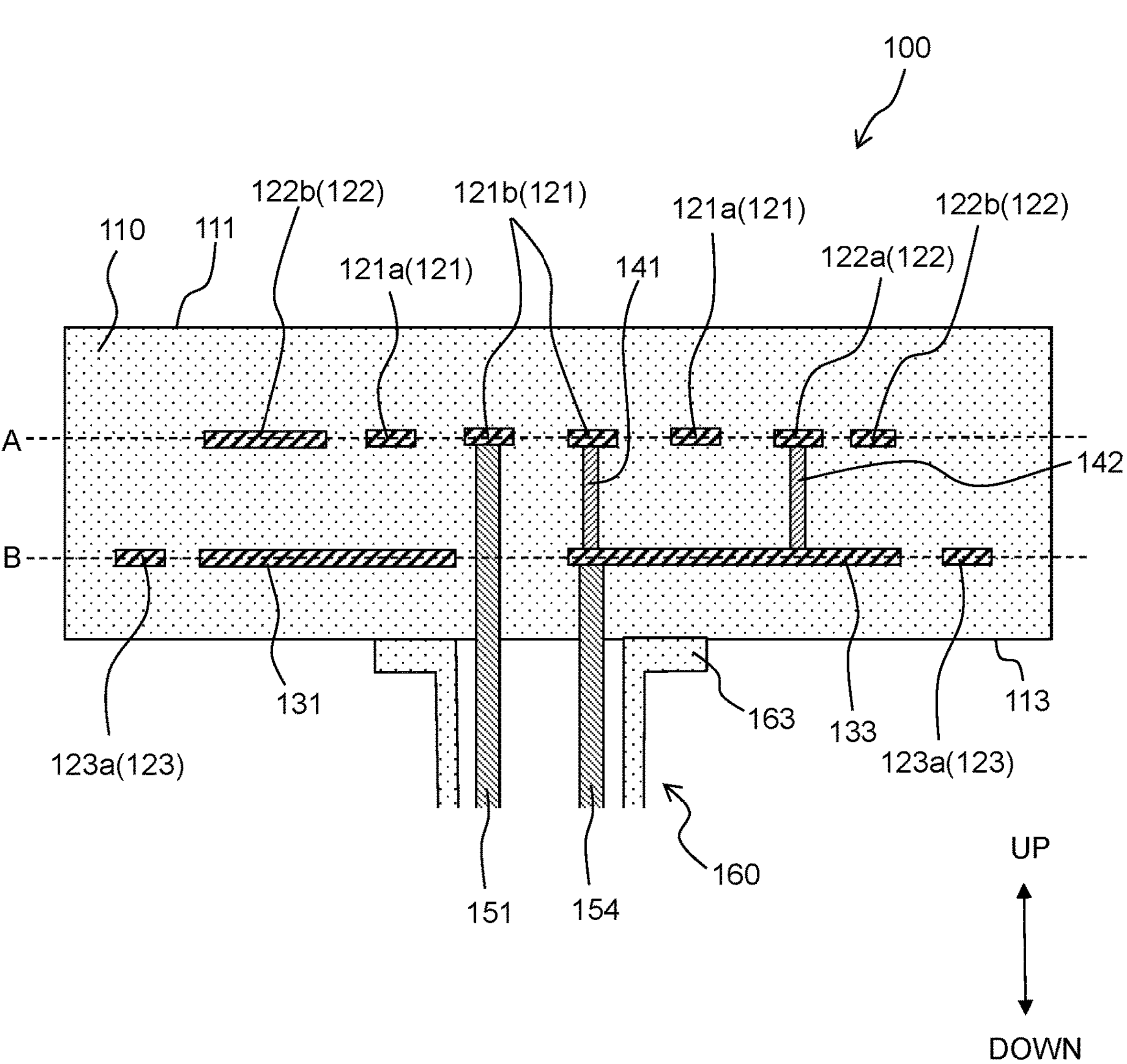
FIG. 2 is a view schematically depicting a vertical cross section of a ceramic base member 110.
Figures 3A, 3B:
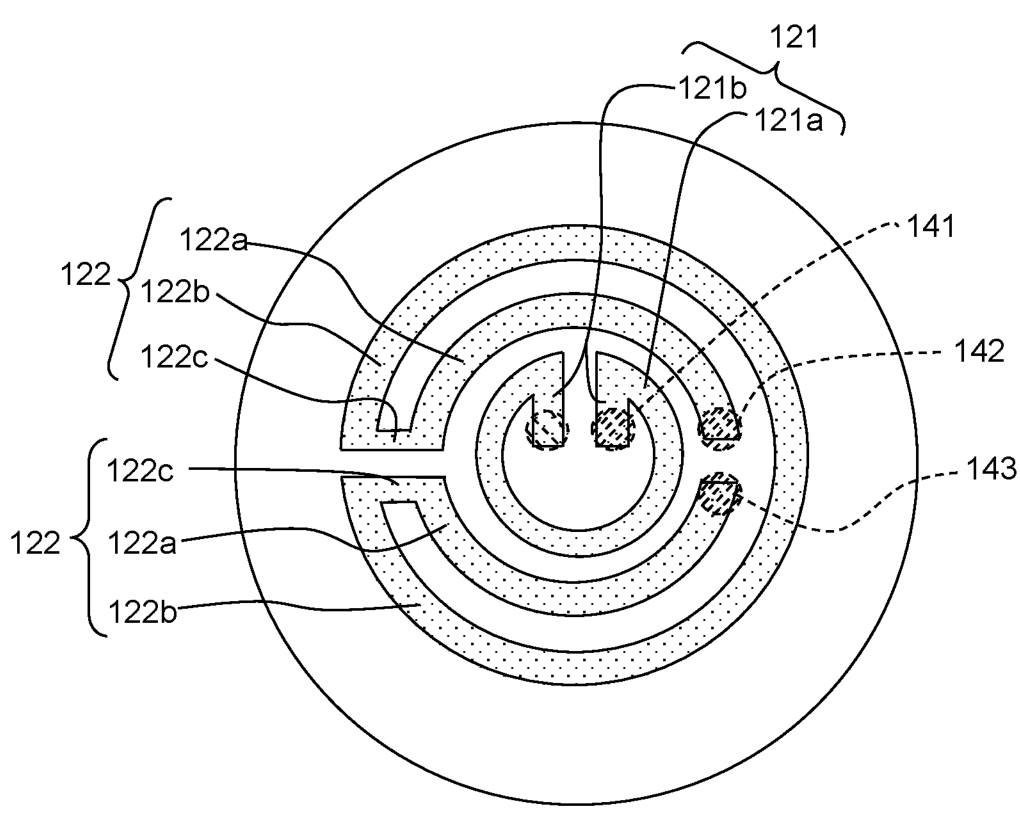
FIG. 3A is a view schematically depicting a cross section of the ceramic base member 110 in a virtual plane A depicted in FIG. 2.
FIG. 3B is a view schematically depicting a cross section of the ceramic base member 110 in a virtual plane B depicted in FIG. 2.

FIG. 2 is a view schematically depicting a vertical cross section of the ceramic base member 110. Virtual planes A and B indicated in broken lines in FIG. 2 are each a horizontal plane orthogonal to the up-down direction. The virtual planes A and B are between the upper surface 111 and a lower surface 113 of the ceramic base member 110 in the up-down direction; the virtual plane A is positioned above the virtual plane B. FIG. 3A is a view schematically depicting a cross section of the ceramic base member 110 in the virtual plane A, and FIG. 3B is a view schematically depicting a cross section of the ceramic base member 110 in the virtual plane B. As depicted in FIGS. 2, 3A and 3B, the three electrodes 121 to 123, the three conductive parts 131 to 133, the five connecting parts 141 to 145, the four terminals 151 to 154 are embedded in the inside of the ceramic base member 110.

<Electrodes 121 to 123>

An explanation will be given about the electrodes 121 to 123, with reference to FIGS. 2, 3A and 3B. The electrodes 121 to 123 are each formed by cutting, in a shape of a belt or band, a heat resisting metal (a high melting point metal of which melting point is not less than 2000° C.) such as, for example, a foil including tungsten (W), molybdenum (Mo) or an alloy including the molybdenum and/or the tungsten; or a mesh which is obtained by weaving a wire including tungsten (W), molybdenum (Mo) or an alloy including the molybdenum and/or the tungsten; etc. In a case that each of the electrodes 121 to 123 is used as a heater electrode, it is preferred that the mesh is used so as to secure the resistance value. It is preferred that the resistance value of each of the electrodes 121 to 123 is in a range of approximately 2Ω to approximately 20Ω. Each of the electrodes 121 to 123 can be formed, for example, by cutting a material made of Mo mesh (wire diameter: 0.1 mm; plain woven #50 mesh) into a predetermined pattern. It is preferred that the purity of each of the tungsten and the molybdenum is not less than 99%. It is preferred that the thickness of each of the electrodes 121 to 123 is in a range of 0.03 mm to 0.2 mm, except for a part of an intersection point of the wire. Further, the width of each of the electrodes 121 to 123 which has been cut in the shape of the band is preferably in a range of 2.5 mm to 20 mm, and more preferably in a range of 5 mm to 15 mm. In the present embodiment, although each of the electrodes 121 to 123 is cut in a shape as depicted in FIGS. 3A and 3B, the shape of each of the electrodes 121 to 123 is not limited to this, and may be changed as appropriate. Note that it is allowable that at least one of an electrostatic chuck electrode which is configured to attract the wafer 10 toward the upper surface 111 by the Coulomb force and a plasma electrode configured to generate a plasma at a location above the ceramic base member 110 is embedded in the inside of the ceramic base member 110, in addition to the electrodes 121 to 123, or instead of providing the electrodes 121 to 123.

As depicted in FIG. 3A, the electrode 121 is arranged substantially at the center of the virtual plane A of the ceramic base member 110, and the electrode 122 is arranged so as to surround the outer side of the electrode 121. The electrode 121 has a ring part 121*a* having a substantially annular ring shape and two linear parts 121*b* extending linearly. The ring part 121*a* has an annular ring shape which is open at an upper side in FIG. 3A, and the two linear parts 121*b* extend, respectively, from both ends of the ring part 121*a* which has the opened annular ring shape, toward a lower side of FIG. 3A. The electrode 122 has two inner side ring parts 122*a* which have a semi-circular annular ring shape and which are arranged so as to surround the outer side of the ring part 121*a* of the electrode 121, an outer side ring part 122*b* which has a substantially annular ring shape and which is arranged so as to surround the outer side of the two inner side ring parts 122*a*, and two linear parts 122*c* which extend linearly so as to link or connect the two inner side ring parts 122*a* and the outer side ring part 122*b*. The outer side ring part 122*b* has an annular ring shape of which left side in FIG. 3A is opened. The two linear parts 122*c* extend in the left-right direction of FIG. 3A so as to join the both ends of the outer side ring parts 122*b* and the two inner side ring parts 122*a*, respectively.

As depicted in FIG. 3B, the electrode 123 is arranged on an outer circumferential part of the virtual plane B of the ceramic base member 110. The electrode 123 includes a ring part 123*a* having a substantially annular ring shape of which upper side in FIG. 3B is opened. In a case that the virtual plane A and the virtual plane B are overlapped, the electrode 123 is arranged at the outside of the electrode 121 and the electrode 122, and the electrode 121, the electrode 122 and the electrode 123 are arranged coaxially such that the electrodes 121, 122 and 123 do not overlap with one another. Namely, the outer diameter of the electrode 123 is greater than the outer diameter of each of the electrodes 121 and 122. With this, the upper surface 111 of the ceramic base member 110 is divided or grouped into three zones corresponding, respectively, to the electrode 121, the electrode 122 and the electrode 123 (a zone overlapping with the electrode 121, a zone overlapping with the electrode 122 and a zone overlapping with the electrode 123 in the up-down direction).

<Conductive Members 131 to 133>

Next, the conductive members 131 to 133 will be explained, with reference to FIGS. 2, 3A and 3B. As depicted in FIG. 3B, the conductive members 131 to 133 are arranged in the same virtual plane B. The conductive members 131 to 133 are arranged so as to occupy an area having a substantially circular shape on the inside of the electrode 123, and so as not to overlap with one another. The conductive member 131 has a substantially semi-circular shape, and occupies a left half of the area inside the electrode 123. A cutout 131C having a rectangular shape is formed in the conductive part 131, at a part thereof in a substantially central part on the right side of the conductive member 131. The conductive member 132 has a shape of a fan of which center angle is approximately 90 degrees, and is arranged on the right side with respect to the conductive member 131 so as to face the lower half of the conductive member 131. The conductive member 133 has a shape of a fan of which center angle is approximately 90 degrees, and is arranged on the right side with respect to the conductive member 131 so as to face the upper half of the conductive member 131.

The total of the areas, respectively, of the conductive members 131 to 133 is preferably not less than 40%, and is more preferably not less than 55%, of an area of a virtual circle defined by the outer diameter of the electrode 123 of which outer diameter is the largest among the electrodes 121 to 123. Further, each of the area of the conductive member 131, the area of the conductive member 132 and the area of the conductive member 133 is preferably not less than 40%, and is more preferably not less than 55% of, an area obtained by dividing the area of the virtual circle by the number or quantity (which is 3(three)) of the electrodes 121 to 123.

The conductive members 131 to 133 are each formed by cutting, in a predetermined shape, a heat resisting metal (a high melting point metal of which melting point is not less than 2000° C.) such as, for example, a foil including tungsten (W), molybdenum (Mo) or an alloy including the molybdenum and/or the tungsten, or a mesh which is obtained by weaving a wire including tungsten (W), molybdenum (Mo) or an alloy including the molybdenum and/or the tungsten, etc., in a similar manner to the electrodes 121 to 123. Note that the conductive members 131 to 133 are preferably formed of a same metallic material as that of the electrodes 121 to 123. In this case, it is possible to perform the production easily and to suppress any distortion due to any difference in the shrinkage factor during the baking. As will be described later on, the conductive member 131 is connected to the terminal 152 and the connecting part 144 (see FIG. 3B). A resistance between the connecting part 144 and a part, of the conductive member 131, connected to the terminal 152 is approximately in a range of approximately 0.01Ω to approximately 1Ω, and is smaller than the resistance of each of the electrodes 121 to 123. The conductive member 132 is connected to the terminal 153 and the connecting part 143 (see FIG. 3B). A resistance between the connecting part 143 and a part, of the conductive member 132, connected to the terminal 153 is in a range of approximately 0.01Ω to approximately 1Ω, and is smaller than the resistance of each of the electrodes 121 to 123. The conductive member 133 is connected to the terminal 154 and the connecting parts 141, 142 and 145 (see FIG. 3B). A resistance between the connecting part 141 and a part, of the conductive member 133, connected to the terminal 154, the resistance between the connecting part 142 and the part, of the conductive member 133, connected to the terminal 154 and the resistance between the connecting part 145 and the part, of the conductive member 133, connected to the terminal 154 are each in a range of approximately 0.01Ω to approximately 1Ω, and is smaller than the resistance of each of the electrodes 121 to 123.

<Connecting Parts 141 to 145>

Next, the connecting parts 141 to 145 will be explained, with reference to FIGS. 2, 3A and 3B. As depicted in FIG. 2, the connecting parts 141 and 142 are arranged between the virtual plane A and the virtual plane B. A lower end of each of the connecting parts 141 and 142 is electrically connected to the conductive member 133. Note that in the following explanation, the term “electrically connected” is simply referred to as “connected”. An upper end of the connecting part 141 is connected to the linear part 121*b* of the electrode 121, and an upper end of the connecting part 142 is connected to the ring part 122*a* of the electrode 122. The connecting part 143 is also arranged between the virtual plane A and the virtual plane B, similarly to the connecting parts 141 and 142 (see FIGS. 3A and 3B). A lower end of the connecting part 143 is connected to the conductive member 132, and an upper end of the connecting part 143 is connected to the ring part 122*a* of the electrode 122. These connecting parts 141 to 143 are a via structure connecting the virtual plane A and the virtual plane B. Further, as depicted in FIG. 3B, the connecting parts 144 and 145 are arranged in the virtual plane B. One end (an end part on the upper side of FIG. 3B) of each of the connecting parts 144 and 145 is connected to the electrode 123. The other end (an end part on the lower side of FIG. 3B) of the connecting part 144 is connected to the conductive member 131, and the other end (an end part on the lower side of FIG. 3B) of the connecting part 145 is connected to the conductive member 133. The connecting parts 144 and 145 are each formed of a same material as that of the plurality of electrodes 121 to 123 and the plurality of conductive member 131 to 133 (a foil including tungsten (W), molybdenum (Mo) or an alloy including the molybdenum and/or the tungsten, or a mesh which is obtained by weaving a wire including tungsten (W), molybdenum (Mo) or an alloy including the molybdenum and/or the tungsten, etc.). With this, the connecting part 144 is integrated with the conductive member 131 and the electrode 123, and the connecting part 145 is integrated with the conductive member 133 and the electrode 123.

<Terminals 151 to 154>

Next, an explanation will be given about the terminals 151 to 154, with reference to FIGS. 2, 3A and 3B. As depicted in FIG. 2, an upper end of the terminal 151 is connected to the linear part 121*b* (see FIG. 3A) of the electrode 121. The upper end of the electrode 121 may make contact with the linear part 121*b* of the electrode 121. Alternatively, the upper end of the terminal 151 and the linear part 121*b* of the electrode 121 may make contact with each other via a pellet formed of tungsten, molybdenum, or an alloy including at least one of the molybdenum and the tungsten. This is similarly applicable to the terminals 152 to 154 which will be described later on. The terminal 151 extends downwardly from the linear part 121*b* of the electrode 121 and further extends downwardly while passing a hollow part of a hollow cylindrical part 161 of a shaft 160 (to be descried later on). Note that as depicted in FIG. 3B, the rectangular-shaped cutout 131C is formed at a substantially central part which is on the right side of the conductive member 131 arranged in the virtual plane B. Since the terminal 151 extends downwardly while passing a part, of the virtual plane B, in which the cutout 131C is formed, the terminal 151 and the conductive member 131 is not electrically conducted.

As depicted in FIG. 2, an upper end of the terminal 154 is connected to the conductive member 133 arranged in the virtual plane B. The terminal 154 extends downwardly from the conductive member 133, and similarly to the terminal 151, extends downwardly while passing the hollow part of the cylindrical part 161 of the shaft 160. Similarly, an upper end of the terminal 152 is connected to the conductive member 131 arranged in the virtual plane B (see FIG. 3B). The terminal 152 extends downwardly from the conductive member 131, and similarly to the terminal 151, extends downwardly while passing the hollow part of the cylindrical part 161 of the shaft 160. Further, an upper end of the terminal 153 is connected to the conductive member 132 arranged in the virtual plane B (see FIG. 3B). The terminal 153 extends downwardly from the conductive member 132, and similarly to the terminal 151, extends downwardly while passing the hollow part of the cylindrical part 161 of the shaft 160. Namely, the four terminals 151 to 154 are arranged in the hollow part of the cylindrical part 161 of the shaft 160.

<Shaft 160>

Figure 4:
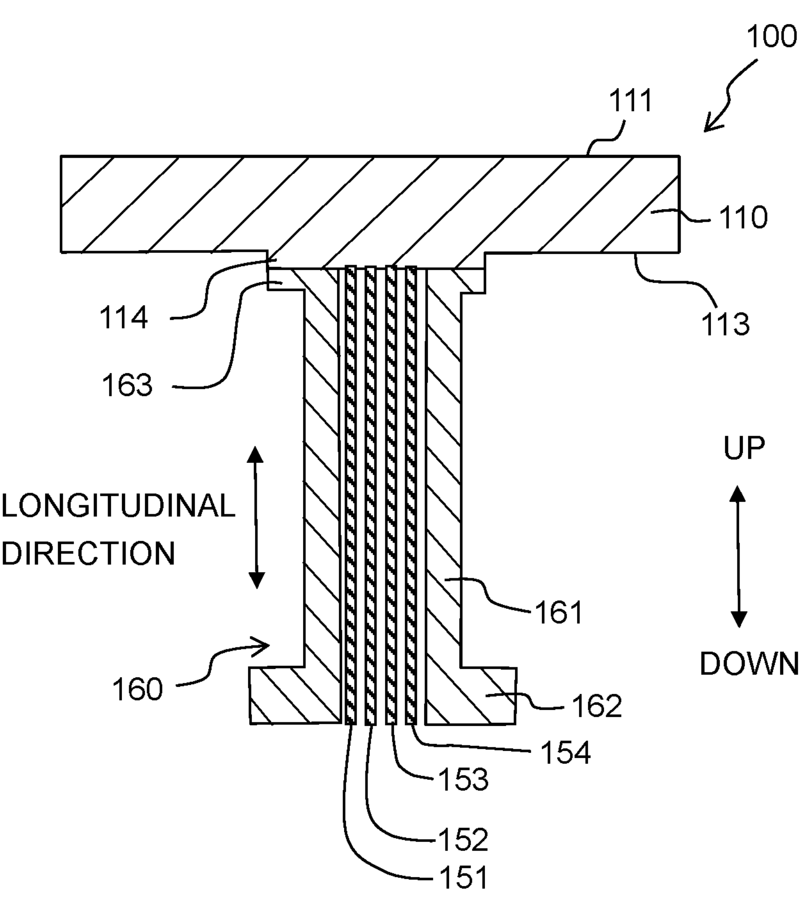
FIG. 4 is an explanatory view depicting a case that a joining projection 114 is provided on a lower surface 113 of the ceramic base member 110.

Next, an explanation will be given about the shaft 160, with reference to FIGS. 1, 2 and 4. As depicted in FIGS. 1, 2 and 4, the shaft 160 is connected to the lower surface 113 of the ceramic base member 110. The shaft 160 has a cylindrical part 161 which has a substantially hollow cylindrical shape, and a large diameter part 162 (see FIG. 1) which is provided at a location below the cylindrical part 161. The large diameter part 162 has a diameter greater than the diameter of the cylindrical part 161. In the following explanation, the longitudinal direction of the cylindrical part 161 is defined as a longitudinal direction of the shaft 160. As depicted in FIG. 1, in a usage state of the substrate holder 100 (a state that the substrate holder 100 is used), the longitudinal direction of the shaft 160 is parallel to the up-down direction.

As depicted in FIG. 2, a through hole extending in the longitudinal direction (see FIG. 1) is formed in the inside (an area on the inner side with respect to the inner diameter) of the cylindrical part 161 of the shaft 160; the terminals 151 to 154 which are configured to supply the electric power to the electrodes 121 to 123 are arranged in the through hole. With this, the electric power is supplied to the electrodes 121 to 123 via the terminals 151 to 154.

Note that it is allowable to provide a projected part 114 for the joining with respect to the shaft 130 (hereinafter referred to as a "joining projected part 114") (see FIG. 4). It is preferred that the shape of the joining projected part 114 is same as the shape of the upper surface of the shaft 160 to which the joining projected part 114 is joined; and that the diameter of the joining projected part 114 is not more than 100 mm. It is allowable that the height (height from the lower surface 113) of the joining projected part 114 is not less than 0.2 mm; it is preferred that the height of the joining projected part 114 is not less than 1 mm. Although there is no limitation to the upper limit of the height of the joining projected part 114, it is preferred that the height of the joining projected part 114 is not more than 20 mm, in view of the easiness in the production. Further, it is preferred that a lower surface of the joining projected part 114 is parallel to the lower surface 113 of the ceramic base member 100. It is allowable that a surface roughness Ra of the lower surface of the joining projected part 114 is not more than 1.6 μm. Note that the surface roughness Ra of the lower surface of the joining projected part 114 is preferably not more than 0.4 μm, and is more preferably not more than 0.2 μm.

An upper surface of the cylindrical part 161 is fixed to the lower surface 113 of the ceramic base member 110 (in a case that the joining projected part 114 is provided, the upper surface of the cylindrical part 161 is fixed to the lower surface of the joining projected part 114). Note that similarly to the ceramic base member 110, the shaft 160 may be formed of a ceramic sintered body such as aluminum nitride, silicon carbide, alumina, silicon nitride, etc. Alternatively, in order to enhance the heat insulating property, the shaft 160 may be formed of a material of which thermal conductivity is lower than that of the ceramic base member 110. Further, it is also allowable that a flange part 163, which is similar to the large diameter part 162 provided at the location below the cylindrical part 161, may be provided on the upper surface of the cylindrical part 161.

<Method of Producing Substrate Holder 100>

Next, an explanation will be given about a method of producing the substrate holder 100. In the following, a case that the ceramic base member 110 and the shaft 160 are formed of aluminum nitride will be explained, as an example. Note, however, that it is presumed that the conductive member 132, the connecting member 143 and the electrode 122 are embedded in the inside of the ceramic base member 110 so that the explanation will be easily understood.

Figure 5A:
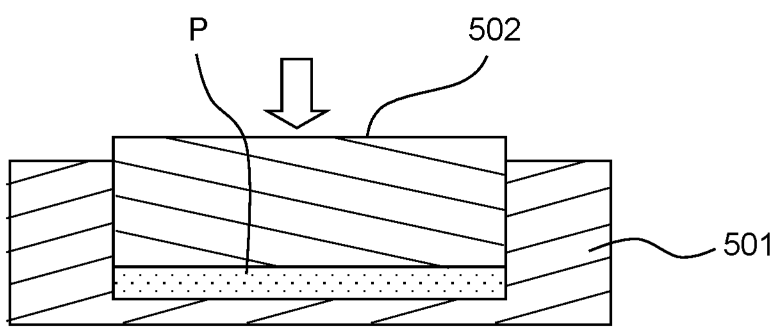
FIGS. 5A to 5E are views depicting a flow of a method of producing the ceramic base member 110.
Figure 5B:
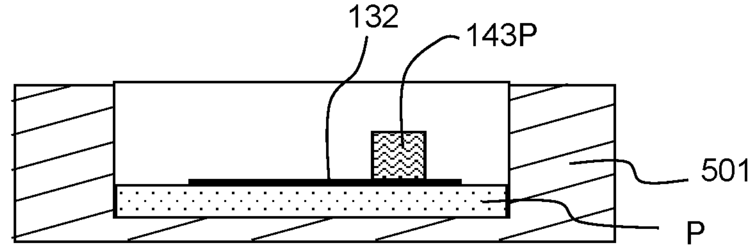

First, a method of producing the ceramic base member 110 will be explained. As depicted in FIG. 5A, granulated powder P which contains aluminum nitride (AlN) powder as a main component thereof is charged to a bottomed mold 501 made of carbon, and is subjected to a temporary pressing with a punch 502. Note that it is preferred that a not more than 5 wt % of sintering agent (for example, Y23) is included in the granulated powder P. Next, as depicted in FIG. 5B, the conductive member 132 which is cut to a predetermined shape is arranged on the temporarily pressed granulated powder P. Note that the conductive member 132 is arranged to be parallel to a plane orthogonal to a pressing direction (the bottom surface of the bottomed mold 501). In this situation, it is allowable to embed a pellet formed of tungsten, molybdenum, or an alloy including at least one of the molybdenum and the tungsten at a position overlapping with the terminal 153 (see FIG. 5B).

Further, as depicted in FIG. 5B, a preform 143P is arranged on the conductive member 132. The preform 143P is a porous material formed of tungsten, molybdenum, or an alloy including at least one of the molybdenum and the tungsten.

Figure 5C:
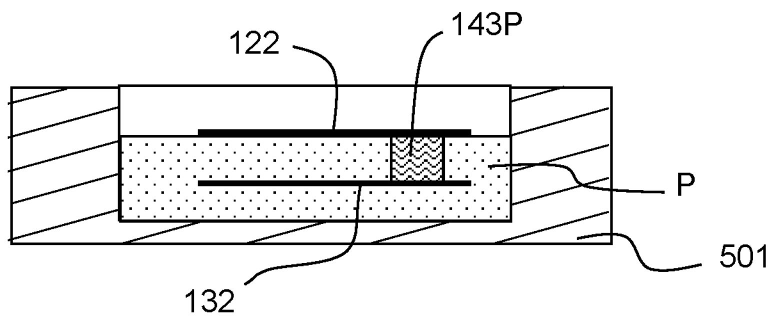

As depicted in FIG. 5C, the granulated power P is further charged to the mold 501 having a bottom (the bottomed mold 501) so as to cover the conductive member 132 and the preform 143P, and is subjected to the temporary pressing with the punch 502 in a similar manner as described above; then, the electrode 122 is arranged on the preform 143P. In this situation, it is allowable to embed a pellet formed of tungsten, molybdenum, or an alloy including at least one of the molybdenum and the tungsten at a position overlapping with the terminal 153 (see FIG. 3B). In a case that the pellet is embedded, it is allowable to make a powder of a high melting point metal such as the tungsten, molybdenum, etc., into a paste, and to coat the paste at a location between the conductive member 132 and the pellet, and at a location between the electrode 122 and the pellet, as necessary. With this, it is possible to enhance the adhesive property between the conductive member 132 and the pellet, and between the electrode 122 and the pellet.

Figure 5D:
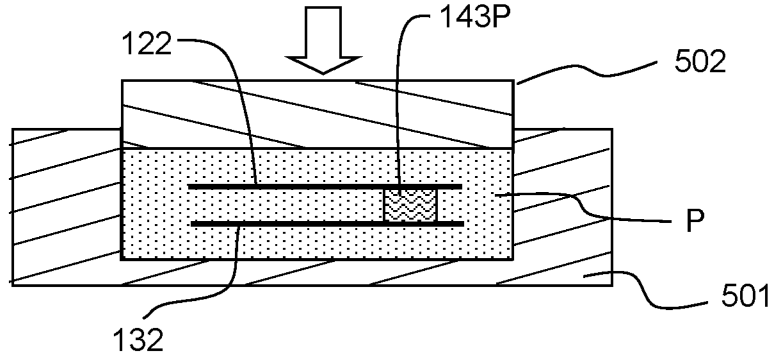
Figure 5E:
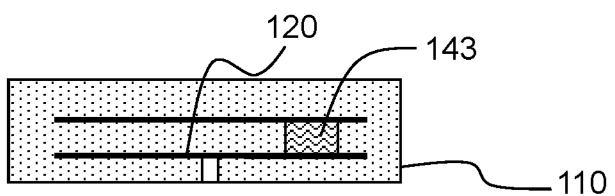

Next, as depicted in FIG. 5D, the granulated powder P is further charged to the bottomed mold 501 so as to cover the electrode 122, and is subjected to the baking in a state that the granulated power P in which the conductive member 132, the preform 143P and the electrode 122 are embedded is pressed. It is preferred that the pressure applied during the baking is not less than 1 MPa. Further, it is preferred that the basking is performed at a temperature which is not less than 1800° C. In this situation, by performing the baking in a state that a predetermined pressure is applied to the preform 143P, the preform 143P which is porous becomes to be a fine via structure, thereby forming the connecting part 143. Note that it is not necessarily indispensable that the porous preform 143P is to be used. It is also possible to form a predetermined hole at a position at which the preform 143P is otherwise arranged, to charge a paste including tungsten or molybdenum and to perform the baking, thereby forming the via structure. Next, as depicted in FIG. 5E, a blind hole driving processing is performed up to a location of the electrode 122 so as to form the terminal 153. Note that in a case that the pellet is embedded, it is possible to perform the blind hole driving processing up to a location of the pellet.

Figure 6A:
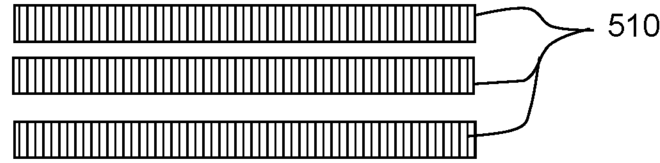
FIGS. 6A to 6D are views depicting a flow of another method of producing the ceramic base member 110.
Figure 6B:
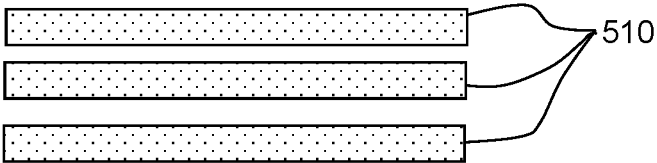

Note that the ceramic base member 110 can be formed also by the following method. As depicted in FIG. 6A, a binder is added to the granulated powder P of the aluminum nitride so as to perform the CIP molding (Cold Isostatic Press molding) followed by being processed to have a disc shape, thereby producing a plurality of molded bodies (compacts) 510 of the aluminum nitride. Next, as depicted in FIG. 6B, a degreasing processing is performed for the plurality of molded bodies 510 so as to remove the binder.

Figure 6C:
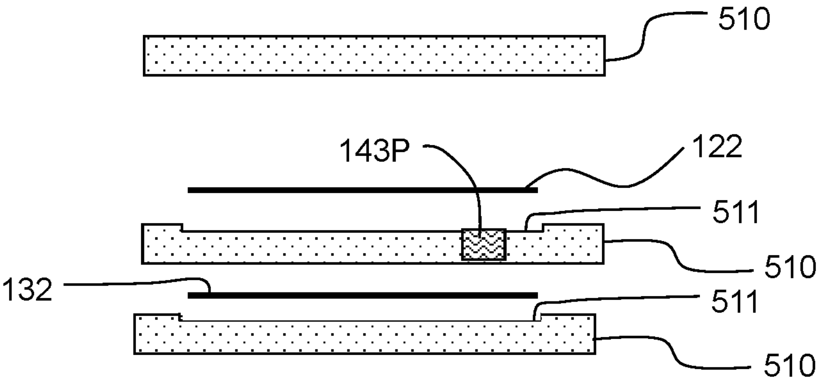

As depicted in FIG. 6C, recessed parts 511 for embedding the conductive member 132 or the electrode 122, and/or a through hole for inserting the preform 143P are formed in degreased molded bodies 510. In this situation, it is allowable to embed a pellet, which is formed of the tungsten, the molybdenum or an alloy including at least one of the molybdenum and the tungsten, at a position which overlaps with the terminal 153 (see FIG. 3B).

Figure 6D:
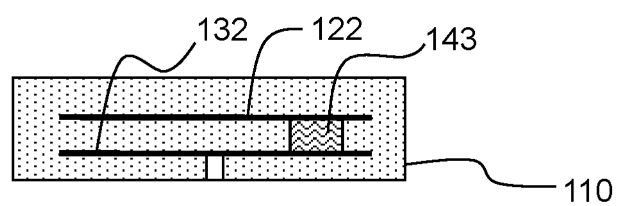

The conductive member 132 and the electrode 122 are arranged, respectively, in a recessed part 511 formed in one of the molded bodies 510 and a recessed part 511 formed in another molded body 510; the preform 143P is arranged in the through hole formed in the another molded body 510; and yet another molded body 510 is stacked on the molded body 510 and the another molded body 510. In a case that the pellet is embedded, it is also allowable to make a powder of a high melting point metal such as the tungsten, molybdenum, etc., into a paste, and to coat the paste at a location between the conductive member 132 and the pellet, and at a location between the electrode 122 and the pellet, as necessary. With this, it is possible to enhance the adhesive property between the conductive member 132 and the pellet, and between the electrode 122 and the pellet. Note that the recessed parts 511 and the through hole may be formed in the molded bodies 510 in advance. Next, as depicted in FIG. 6D, the plurality of stacked molded bodies 510 is subjected to the baking in a state that the plurality of stacked molded bodies 510 is pressed, thereby preparing a baked body. It is preferred that the pressure applied during the baking is not less than 1 MPa. Further, it is possible that the basking is performed at a temperature which is not less than 1800° C. In this situation, similarly to the above-described step, by performing the baking in a state that a predetermined pressure is applied to the preform 143P, the preform 143P which is porous becomes to be a fine via structure, thereby forming the connecting part 143. Since the steps after producing the baked boy are similar to the steps as described above, any explanation therefor will be omitted.

An outer shaping processing is performed with respect to the upper surface 111 of the ceramic base member 110 formed in such a manner. It is allowable to provide, on the lower surface 113 of the ceramic base member 110, the joining projected part 114 (see FIG. 10) which projects from the lower surface 113.

Next, an explanation will be given about a method of producing the shaft 160 and a method of joining the shaft 160 and the ceramic base member 110. First, granulated powder P of aluminum nitride to which several wt % of a binder has been added is molded at a hydrostatic pressure (approximately 1 MPa) so as to obtain a molding (compact), and the obtained molding is processed to have a predetermined shape. Note that the outer diameter of the shaft 160 is in a range of approximately 30 mm to approximately 100 mm. It is allowable to provide, on an end surface of the cylindrical part 161 of the shaft 160, the flange part 163 having a diameter which is greater than the outer diameter of the cylindrical part 161 (see FIG. 4). The length of the cylindrical part 161 may be, for example, to be in a range of 50 mm to 500 mm. After the molding is processed to have the predetermined shape, the molding is baked in an atmosphere of nitrogen. For example, the molding is subjected to the baking at a temperature of 1900° C. for two hours so as to obtain a sintered body (sintered molding). Then, by processing the sintered molding into a predetermined shape, the shaft 160 is formed. It is possible to fix the upper surface of the cylindrical part 161 and the lower surface 113 of the ceramic base member 110 by a diffusion bonding (joining) at a temperature not more than 1600° C. and under a uniaxial pressure of not less than 1 MPa. In this case, the surface roughness Ra of the lower surface 113 of the ceramic base member 110 is preferably not more than 0.4 μm more preferably not more than 0.2 μm. Further, it is also possible to join the upper surface of the cylindrical part 161 and the lower surface 113 of the ceramic base member 110 by using a joining or bonding agent. As the joining agent, it is possible to use, for example, an AlN joining agent paste to which 10 wt % of Y2O3 has been added. For example, it is possible to join the upper surface of the cylindrical part 161 and the lower surface 113 of the ceramic base member 110 by coating the above-described AlN joining agent paste, at a thickness of 15 μm, in the interface between the upper surface of the cylindrical part 161 and the lower surface 113 of the ceramic base member 110, and by performing heating therefor at a temperature of 1700° C. for one hour while applying a force of 5 kPa in a direction perpendicular to the upper surface 111 (the longitudinal direction of the shaft 160). Alternatively, it is possible to join the upper surface of the cylindrical part 161 and the lower surface 113 of the ceramic base member 110 by screwing, blazing, etc.

<Power Supply Route of Electrodes 121 to 123>

As depicted in FIGS. 2 and 3A, the terminal 151 is connected to one end (the linear part 121*b* on the left side of FIG. 3A) of the electrode 121. The other end (the linear part 121*b* on the right side of FIG. 3A) of the electrode 121 is connected to the connecting part 141. As depicted in FIG. 3B, the connecting part 141 is connected to the conductive member 133, and further the conductive member 133 is connected to the terminal 154. With this, an electric circuit starting from the terminal 151, passing the electrode 121, the connecting part 141 and the conductive member 133 and reaching the terminal 154 is formed. By making the terminal 154 to be a ground terminal and by connecting an external power source to the terminal 151 and the terminal 154, it is possible to energize the electrode 121. Namely, the conductive member 133 is connected to the ground.

As depicted in FIG. 3B, the terminal 153 is connected to the conductive member 132, and the conductive member 132 is connected to the connecting part 143. As depicted in FIG. 3A, the connecting part 143 is connected to one end of the electrode 122, and the other end of the electrode 122 is connected to the connecting part 142. As depicted in FIG. 3B, the connecting part 142 is connected to the conductive member 133, and further the conductive member 133 is connected to the terminal 154. With this, an electric circuit starting from the terminal 153, passing the conductive member 132, the connecting part 143, the electrode 122 and the conductive member 133 and reaching the terminal 154 is formed. By making the terminal 154 to be a ground terminal and by connecting the external power source to the terminal 153 and the terminal 154, it is possible to energize the electrode 122. Namely, the conductive member 133 is connected to the ground. Further, the conductive member 132 which is arranged on a plane same as the conductive member 133 is connected to the external power source.

As depicted in FIG. 3B, the terminal 152 is connected to the conductive member 131, and the conductive member 131 is connected to the connecting part 144. Further, the connecting part 144 is connected to one end of the electrode 123, and the other end of the electrode 123 is connected to the connecting part 145. The connecting part 145 is connected to the conductive member 133, and further the connecting member 133 is connected to the terminal 154. With this, an electric circuit starting from the terminal 152, passing the connective member 131, the connecting part 144, the electrode 123, the connecting part 145 and the conductive member 133 and reaching the terminal 154 is formed. By making the terminal 154 to be the ground terminal and by connecting the external power source to the terminal 153 and the terminal 154, it is possible to energize the electrode 123. Namely, the conductive member 133 is connected to the ground. Further, the conductive member 131 which is arranged on a plane same as the conductive member 133 is connected to the external power source.

Technical Effect of Embodiment

In the present embodiment, the substrate holder 100 is provided with the ceramic base member 110, the electrodes 121 to 123, the conductive members 131 to 133, the connecting parts 141 to 145 and the terminals 151 to 154. The electrodes 121 to 123, the conductive members 131 to 133 and the connecting parts 141 to 145 are embedded in the ceramic base member 110. Further, the connecting part 141 connects the electrode 121 and the conductive member 133, the connecting part 142 connects the electrode 122 and the conductive member 133, and the connecting part 145 connects the electrode 123 and the conductive member 133. The connecting part 143 connects the electrode 122 and the conductive member 132. The connecting part 144 connects the electrode 123 and the conductive member 131. The terminal 151 is connected to the electrode 121, the terminal 152 is connected to the conductive member 131, the terminal 153 is connected to the conductive member 132, and the terminal 154 is connected to the conductive member 133.

By connecting two terminals, respectively, to the both ends of each of the electrodes, it is possible to energize each of the electrodes from the external power source via the two terminals. In this case, however, the terminals of which number (quantity) is two times the number of the electrodes are required. In contrast, in the above-described embodiment, the connecting part 141 connected to the electrode 121, the connecting part 142 connected to the electrode 122 and the connecting part 145 connected to the electrode 123 are connected to the conductive member 133. Further, the terminal 154 is connected to the conductive member 133. Accordingly, the plurality of electrodes 121 to 123 is connected to the one terminal 154 via the one conductive member 133. Owing to such a configuration, the number (4 (four)) of the terminals 154 to 155 can be made smaller than two times the number (3 (three)) of the electrodes 121 to 123. Further this, the space for arranging the plurality of terminals therein can be made small. Further, since the electrode and the terminal are connected via the conductive member and the connecting part, it is possible to made the degree of the freedom of arranging the terminals to be high, as compared with a case that the electrode and the terminal are connected not via the conductive member and the connecting part. For example, it is possible to gather the terminals 151 to 154 to a location in the vicinity of the center of the lower surface 113 of the ceramic base member 110 so that all the terminals 151 to 154 pass through the through hole of the shaft 160, as in the present embodiment.

As described above, the resistance value between the connecting part 144 and the part, of the conductive member 131, which is connected to the terminal 152 is smaller than the resistance value of any one of the electrodes 121 to 123. The resistance value between the connecting part 143 and the part, of the conductive member 132, which is connected to the terminal 153 is smaller than the resistance value of any one of the electrodes 121 to 123. The resistance value between the connecting part 141 and the part, of the conductive member 133, which is connected to the terminal 154, the resistance value between the connecting part 142 and the part, of the conductive member 133, which is connected to the terminal 154 and the resistance value between the connecting part 145 and the part, of the conductive member 133, which is connected to the terminal 154 are each smaller than the resistance value of any one of the electrodes 121 to 123. With this, even in a case that the electrode and the terminal are connected via the conductive member and the connecting part, it is possible to suppress, as much as possible, the generation of heat in the conductive member.

In the embodiment, the cutout 131C is provided on the conductive member 131, and the terminal 151 extends upward, while passing the area in which the cutout 131C is provided, so as not to make contact with the conductive member 131. With this, it is possible to arrange the terminal at a position overlapping with the conductive member which is not electrically connected to the terminal, thereby making it possible to enhance the degree of the freedom of arranging the terminal. Further, since it is possible to connect the terminal and the electrode not via the connecting member embedded in the inside of the ceramic base member 110, it is possible to reduce the risk of any connection failure in the inside of the ceramic base member 110.

In the above-described embodiment, the total of the areas, respectively, of the conductive members 131 to 133 is preferably not less than 40% of an area of a virtual circle defined by the outer diameter of the electrode 123 of which outer diameter is the largest among the electrodes 121 to 123. In this case, since the total of the areas, respectively, of the conductive members 131 to 133 is relatively large, it is possible to make the degree of the freedom of arranging the terminals and/or the connecting members to be connected to the conductive members 131 to 133 to be high. Further, in a case that the total of the areas, respectively, of the conductive members 131 to 133 is relatively large, it is possible to make the area of each of the conductive members to be also large, thereby making it possible to improve the heat transfer characteristic. Namely, since the heat reflectance of the embedded conductive members is large, it is possible to reflect the Joule heat emitted from the electrodes 121 to 123, thereby making it possible to suppress such a situation that the heat escapes toward the shaft 160.

In the above-described embodiment, each of the area of the conductive member 131, the area of the conductive member 132 and the area of the conductive member 133 is not less than 40% of an area obtained by dividing the area of the virtual circle, defined by the outer diameter of the electrode 123 of which outer diameter is the largest among the electrodes 121 to 123, by the number or quantity (which is 3 (three)) of the electrodes 121 to 123. In this case, since the area of each of the conductive members 131 to 133 is relatively large, it is possible to make the degree of the freedom of arranging the terminals and/or the connecting members to be connected to the conductive members 131 to 133 to be high. Further, since it is possible to make the area of each of the conductive members 131 to 133 to be relatively large, it is possible to improve the heat transfer characteristic, as described above.

In the embodiment, the conductive members 131 to 133 and the electrodes 121 to 123 are formed of the same material (the foil including tungsten (W), molybdenum (Mo) or an alloy including the molybdenum and/or the tungsten, or the mesh which is obtained by weaving a wire including tungsten (W), molybdenum (Mo) or an alloy including the molybdenum and/or the tungsten). With this, it is possible to easily produce the substrate holder 100. In the embodiment, the connecting parts 141 to 143 are each the via structure connecting the virtual plane A and the virtual plane B. Further, the connecting parts 144 and 145 are each formed of the same material as that of the electrodes 121 to 123 and the conductive members 131 to 133 (the foil including tungsten (W), molybdenum (Mo) or an alloy including the molybdenum and/or the tungsten, or the mesh which is obtained by weaving a wire including tungsten (W), molybdenum (Mo) or an alloy including the molybdenum and/or the tungsten). Furthermore, the connecting part 144 is integrally formed with the conductive member 131 and the electrode 123, and the connecting part 145 is integrally formed with the conductive member 133 and the electrode 123. With this, it is possible to connect the connecting part to the electrode and/or the conductive member in an ensured manner, thereby making it possible to reduce the risk of any connection failure. Note that the material of the electrodes 121 to 123 may be different from the material of the conductive members 131 to 133. In such a case, it is possible to increase the degree of freedom of the selection of the material forming the electrodes 121 to 123 and of the material forming the conductive members 131 to 133. For example, the electrodes 121 to 123 may be formed of the mesh which is obtained by weaving a wire including tungsten (W), molybdenum (Mo) or an alloy including the molybdenum and/or the tungsten, in order to make the area thereof to be small to thereby increase the resistance value and to make the heat value (calorific power) to be great. Further, the conductive members 131 to 133 may be formed of the foil including tungsten (W), molybdenum (Mo) or an alloy including the molybdenum and/or the tungsten, in order to make the area thereof to be great to thereby lower the resistance value and to suppress the heat value.

In the embodiment, the cylindrical or tubular shaped shaft 160 is provided on the lower surface 113 of the ceramic base member 110. Further, the terminals 151 to 154 are arranged on the inner side with respect to the outer diameter of the shaft 160. In this case, by hermetically sealing the inner side and the outer side of the cylindrical shaped shaft 160, it is possible to protect the terminals 151 to 154 from the external environment of the shaft 160. Furthermore, by providing the cylindrically shaped shaft 160, it is possible to prevent the ceramic base member 110 from directly making contact with an external apparatus, etc. With this, it is possible to thermally insulate the ceramic base member 110 from the surrounding thereof, and to enhance the thermal uniformity (soaking property) of the ceramic base member 110.

Modifications

The embodiment as described above is merely an example, and may be changed as appropriate. For example, the shape and the size of each of the ceramic base member 110 and the shaft 160 are not limited to or restricted by those of the above-described embodiment, and may be changed as appropriate. Further, the shape, the size, the number (quantity), etc., of each of the electrode, the conductive member, the connecting part and the terminal embedded in the ceramic base member 110 may be changed as appropriate.

In the embodiment, the molybdenum, the tungsten or an alloy including the molybdenum and/or the tungsten is used as the material forming the electrodes 121 to 123. The present disclosure, however, is not limited to such an aspect. For example, it is allowable to use a metal or an alloy different from the molybdenum and the tungsten.

In the embodiment, although the base holder 100 is provided with the three electrodes 121 to 123 embedded in the ceramic base member 110, the present disclosure is not limited to such an aspect; the number of the electrode embedded in the ceramic base member 110 of the substrate holder 100 may be 2 (two) or not less than 4 (four). For example, as depicted in FIGS. 7, 8A and 8B, four electrodes 221 to 224 may be embedded in a ceramic base member 210.

Figure 7:
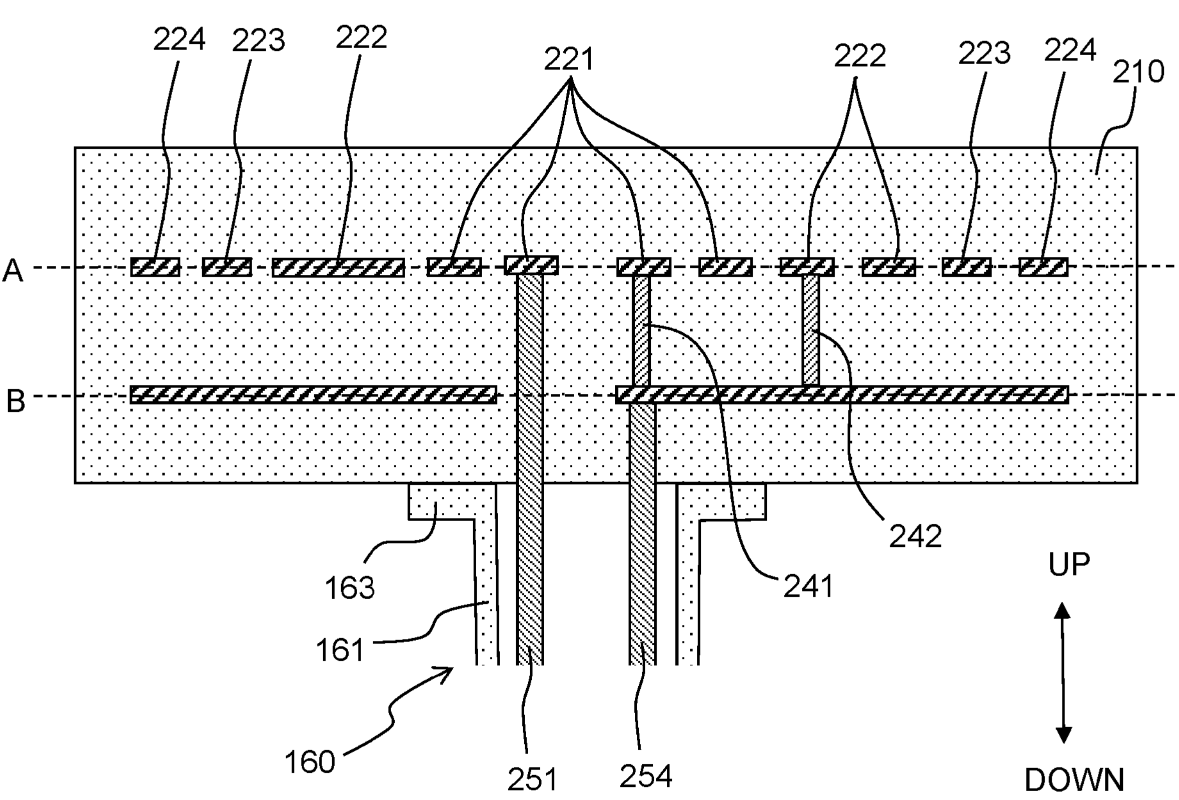
FIG. 7 is a view of a ceramic base member 210 in which four electrodes 221 to 224 are embedded, corresponding to FIG. 2.
Figures 8A, 8B:
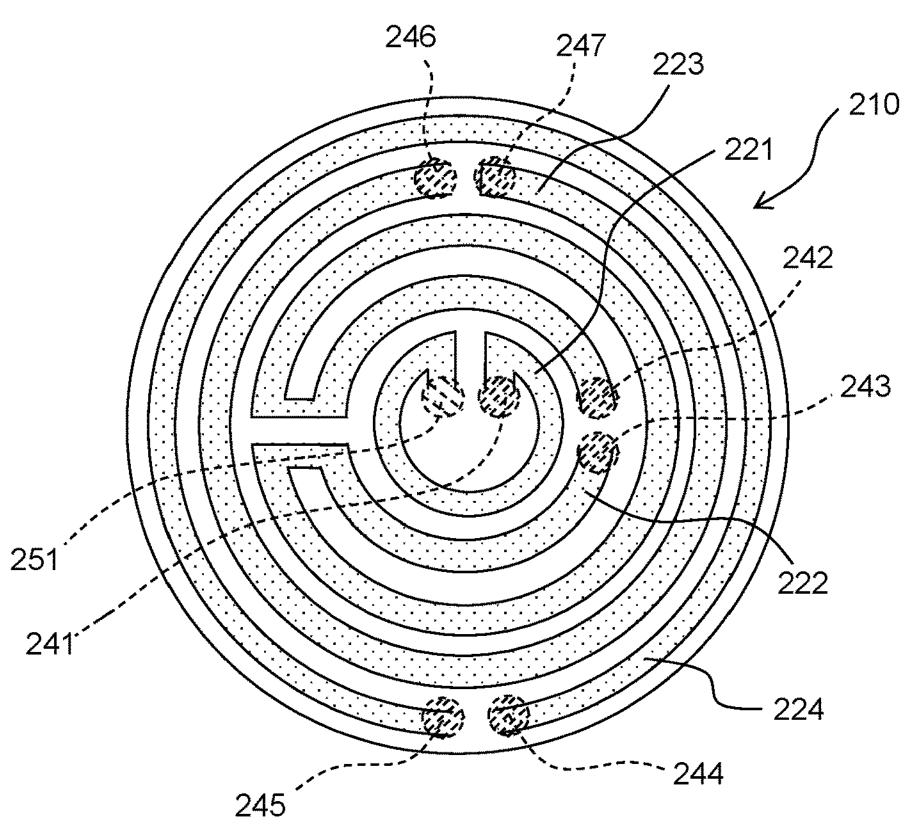
FIG. 8A is a view of the ceramic base member 210 in which the four electrodes 221 to 224 are embedded, corresponding to FIG. 3A.
FIG. 8B is a view of the ceramic base member 210 in which the four electrodes 221 to 224 are embedded, corresponding to FIG. 3B.

As depicted in FIGS. 7, 8A and 8B, the four electrodes 221 to 224 are embedded in a virtual plane A of the ceramic base member 210, and four conductive members 231 to 234 are arranged in a virtual plane B of the ceramic base member 210. Since the material of the electrodes 221 to 224 is same as that of the above-described electrodes 121 to 123, the material of the conductive members 231 to 234 is same as that of the above-described conductive members 151 to 153, any explanation therefor will be omitted.

As depicted in FIGS. 7 and 8A, the terminal 251 is connected to one end of the electrode 221. The other end of the electrode 221 is connected to the connecting part 241. As depicted in FIG. 8B, the connecting part 241 is connected to the conductive member 234, and further the conductive member 234 is connected to the terminal 254. With this, an electric circuit starting from the terminal 251, passing the electrode 221, the connecting part 241 and the conductive member 234 and reaching the terminal 254 is formed. By making the terminal 254 to be a ground terminal and by connecting an external power source to the terminal 251 and the terminal 254, it is possible to energize the electrode 221.

As depicted in FIG. 8B, the terminal 253 is connected to the conductive member 233, and further the conductive member 233 is connected to the connecting part 243. The connecting part 243 is connected to one end of the electrode 222. The other end of the electrode 222 is connected to the connecting part 242. As depicted in FIG. 8B, the connecting part 242 is connected to the conductive member 234, and further the conductive member 234 is connected to the terminal 254. With this, an electric circuit starting from the terminal 253, passing the conductive member 233, the connecting part 243, the electrode 222, the connecting part 242 and the conductive member 234 and reaching the terminal 254 is formed. By making the terminal 254 to be a ground terminal and by connecting the external power source to the terminal 253 and the terminal 254, it is possible to energize the electrode 222.

As depicted in FIG. 8B, the terminal 255 is connected to the conductive member 231, and further the conductive member 231 is connected to the connecting part 246. The connecting part 246 is connected to one end of the electrode 223. The other end of the electrode 223 is connected to the connecting part 247. As depicted in FIG. 8B, the connecting part 247 is connected to the conductive member 234, and further the conductive member 234 is connected to the terminal 254. With this, an electric circuit starting from the terminal 255, passing the conductive member 231, the connecting part 246, the electrode 223, the connecting part 247 and the conductive member 234 and reaching the terminal 254 is formed. With this, by making the terminal 254 to be the ground terminal and by connecting the external power source to the terminal 255 and the terminal 254, it is possible to energize the electrode 223.

As depicted in FIG. 8B, the terminal 252 is connected to the conductive member 232, and further the conductive member 232 is connected to the connecting part 245. The connecting part 245 is connected to one end of the electrode 224. The other end of the electrode 224 is connected to the connecting part 244. As depicted in FIG. 8B, the connecting part 244 is connected to the conductive member 234, and further the conductive member 234 is connected to the terminal 254. With this, an electric circuit starting from the terminal 252, passing the conductive member 232, the connecting part 245, the electrode 224, the connecting part 244 and the conductive member 234 and reaching the terminal 254 is formed. By making the terminal 254 to be the ground terminal and by connecting the external power source to the terminal 252 and the terminal 254, it is possible to energize the electrode 224.

As described above, also in a case that the four electrodes 221 to 224 are embedded in the ceramic base member 110, it is possible to achieve the effect similar to that achieved by the above-described substrate holder 100.

In the above-described embodiment, although the substrate holder 100 is provided with the shaft 160, the present disclosure is not limited to such an aspect; it is not necessarily indispensable that the substrate holder 100 is provided with the shaft 160.

In the foregoing, although the explanation has been given by using the embodiment and the modifications thereof of the present disclosure, the technical scope of the present disclosure is not limited to the scope or range of the above-described description. It is apparent to a person skilled in the art that various changes or improvement can be made to the above-described embodiment and the modifications thereof. It is apparent, also from the description of the claims, to the person skilled in the art that an aspect obtained by adding such a change or improvement is also included in the technical scope of the present disclosure.

The order of executing of the respective processings in the production method indicated in the specification and in the drawings can be executed in an arbitrary order, unless the order is clearly described, and/or unless the output of a preceding processing is used in a succeeding processing. Even in a case that the explanation is given by using, for the sake of convenience, the terms such as “at first”, “first”, “next”, “then”, etc., it is not meant that it is necessarily indispensable that the respective processings are executed in this order.

The present disclosure can be realized also as the aspects as follows:

First Example of Application

A substrate holder including: a ceramic base member having an upper surface and a lower surface facing the upper surface in an up-down direction; a plurality of electrodes embedded in the ceramic base member; at least one conductive member embedded in the ceramic base member; a plurality of connecting parts electrically connecting the plurality of electrodes and the at least one conductive member such that each of the at least one conductive member is connected to at least one of the plurality of electrodes; a plurality of terminals each of which is provided on at least one of the plurality of electrodes or the at least one conductive member. A resistance value between a connecting part, of the plurality of connecting parts, connected to the at least one conductive member and a terminal, of the plurality of terminals, provided on the at least one conductive member is smaller than a resistance value between both ends of each of the plurality of electrodes. The number of the plurality of terminals is smaller than two times the number of the plurality of electrodes.

Second Example of Application

The substrate holder according to First Example of Application, wherein the plurality of electrodes and at least a part of the at least one conductive member are a mesh obtained by weaving a wire of at least one kind of metal selected from the group consisting of: tungsten, molybdenum and an alloy including the molybdenum and/or the tungsten.

Third Example of Application

The substrate holder according to First or Second Example of Application, wherein a thickness of each of the plurality of electrodes and a thickness of the at last one conductive member are in a range of 0.03 mm to 0.2 mm, except for an intersection point of the wire.

Fourth Example of Application

The substrate holder according to any one of First to Third Examples of Application, wherein an opening or a cutout is provided on one of the at least one conductive member. At least one of the plurality of terminals is located in the opening or the cutout.

Fifth Example of Application

The substrate holder according to any one of First to Fourth Examples of Application, wherein. the ceramic base member has a shape of a disc. A sum of an area of the at least one conductive member has a value which is not less than 40% of an area of a virtual circle having a radius defined by an outer diameter of a greatest electrode, of the plurality of electrodes, of which outer diameter is greatest among the plurality of electrodes.

Sixth Example of Application

The substrate holder according to any one of First to Fifth Examples of Application, wherein the ceramic base member has a shape of a disc. An area of the at least one conductive member is not less than 40% of a value obtained by dividing, by the number of the plurality of electrodes, an area of a virtual circle having a radius defined by an outer diameter of a greatest electrode, of the plurality of electrodes, of which outer diameter is greatest among the plurality of electrodes.

Seventh Example of Application

The substrate holder according to any one of First to Sixth Examples of Application, wherein the plurality of electrodes is made of a same material as a material of the at least one conductive member.

Eighth Example of Application

The substrate holder according to Seventh Example of Application, wherein each of the plurality of connecting members has a via structure, or has a structure made of the same material and integrally formed with one of the plurality of electrodes and the at least one conductive member.

Ninth Example of Application

The substrate holder according to any one of First to Eighth Examples of Application, wherein the plurality of electrodes is made of a different material from a material of the at least one conductive member.

Tenth Example of Application

The substrate holder according to any one of First to Ninth Examples of Application, further including a tubular shaft joined to the lower surface of the ceramic base member. The plurality of terminals is arranged on an inner side with respect to an outer diameter of the shaft.

What is claimed is:

1. A substrate holder comprising:

a ceramic base member having an upper surface and a lower surface facing the upper surface in an up-down direction, the lower surface having a central region;

a plurality of electrodes embedded in the ceramic base member;

at least two conductive members arranged in a same plane and embedded in the ceramic base member;

a plurality of connecting parts electrically connecting the plurality of electrodes and the at least two conductive members such that each of the at least two conductive members is connected to at least one of the plurality of electrodes;

a plurality of terminals each of which is provided on at least one of the plurality of electrodes or at least one of the at least two conductive members, wherein a resistance value between a connecting part, of the plurality of connecting parts, connected to the at least one of the at least two conductive members and a terminal, of the plurality of terminals, provided on the at least one of the at least two conductive members is smaller than a resistance value between both ends of each of the plurality of electrodes to suppress the generation of heat in the at least one of the at least two conductive members, the number of the plurality of terminals is smaller than two times the number of the plurality of electrodes, and each of the plurality of terminals extends downwardly from the central region of the lower surface of the ceramic base member, an opening or a cutout is provided in one of the at least two conductive members, and a terminal of the plurality of terminals is located in the opening or the cutout, and the terminal located in the opening or the cutout is electrically connected to an other of the at least two conductive members via one of the plurality of electrodes and one of the plurality of connecting parts.

2. The substrate holder according to claim 1, wherein the plurality of electrodes and at least a part of the at least two conductive members are a mesh obtained by weaving a wire of at least one kind of metal selected from the group consisting of: tungsten, molybdenum and an alloy including the molybdenum and/or the tungsten.

3. The substrate holder according to claim 2, wherein a thickness of each of the plurality of electrodes and a thickness of the at least two conductive members are in a range of 0.03 mm to 0.2 mm, except for an intersection point of the wire.

4. The substrate holder according to claim 1, wherein the ceramic base member has a shape of a disc, and a sum of an area of the at least two conductive members has a value which is not less than 40% of an area of a virtual circle having a radius defined by an outer diameter of a greatest electrode, of the plurality of electrodes, of which outer diameter is greatest among the plurality of electrodes.

5. The substrate holder according to claim 1, wherein the ceramic base member has a shape of a disc, and an area of the at least two conductive members is not less than 40% of a value obtained by dividing, by the number of the plurality of electrodes, an area of a virtual circle having a radius defined by an outer diameter of a greatest electrode, of the plurality of electrodes, of which outer diameter is greatest among the plurality of electrodes.

6. The substrate holder according to claim 1, wherein the plurality of electrodes is made of a same material as a material of the at least two conductive members.

7. The substrate holder according to claim 6, wherein each of the plurality of connecting members has a via structure, or has a structure made of the same material and integrally formed with one of the plurality of electrodes and the at least two conductive members.

8. The substrate holder according to claim 1, wherein the plurality of electrodes is made of a different material from a material of the at least two conductive members.

9. The substrate holder according to claim 1, further comprising a tubular shaft joined to the lower surface of the ceramic base member, wherein the plurality of terminals is arranged on an inner side with respect to an outer diameter of the shaft.

10. A substrate holder comprising:

a ceramic base member having an upper surface and a lower surface facing the upper surface in an up-down direction, the lower surface having a central region;

a plurality of electrodes embedded in the ceramic base member;

at least two conductive members arranged in a same plane and embedded in the ceramic base member;

a plurality of connecting parts electrically connecting the plurality of electrodes and the at least two conductive members such that each of the at least two conductive members is connected to at least one of the plurality of electrodes;

a plurality of terminals each of which is provided on at least one of the plurality of electrodes or at least one of the at least two conductive members, wherein a resistance value between a connecting part, of the plurality of connecting parts, connected to the at least one of the at least two conductive members and a terminal, of the plurality of terminals, provided on the at least one of the at least two conductive members is smaller than a resistance value between both ends of each of the plurality of electrodes to suppress the generation of heat in the at least one of the at least two conductive members, the number of the plurality of terminals is smaller than two times the number of the plurality of electrodes, and each of the plurality of terminals extends downwardly from the central region of the lower surface of the ceramic base member, an opening or a cutout is provided in one of the at least two conductive members, and a terminal of the plurality of terminals is located in the opening or the cutout, the terminal located in the opening or the cutout is electrically connected to an other of the at least two conductive members via one of the plurality of electrodes or one of the plurality of connecting parts, and a terminal, of the plurality of terminals, that is not located in the opening or the cutout is electrically connected to the other of the at least two conductive members via another of the plurality of electrodes or another of the plurality of connecting parts.

11. The substrate holder according to claim 10, wherein the terminal, of the plurality of terminals, that is not located in the opening or the cutout, is connected to one of the at least two conductive members except for the other of the at least two conductive members, and is electrically connected to the other of the at least two conductive members via another of the plurality of electrodes or another of the plurality of connecting parts.

12. The substrate holder according to claim 10, wherein the terminal, of the plurality of terminals, that is not located in the opening or the cutout, is connected to one of the at least two conductive members, and is electrically connected to the other of the at least two conductive members via another of the plurality of electrodes or another of the plurality of connecting parts.

* * * * *